United States Patent
Kim et al.

(10) Patent No.: US 8,966,746 B2
(45) Date of Patent: Mar. 3, 2015

(54) METHOD OF FABRICATING CAVITY CAPACITOR EMBEDDED IN PRINTED CIRCUIT BOARD

(75) Inventors: Han Kim, Yongin-si (KR); Je-Gwang Yoo, Yongin-si (KR); Chang-Sup Ryu, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 987 days.

(21) Appl. No.: 13/064,847

(22) Filed: Apr. 20, 2011

(65) Prior Publication Data

US 2011/0197409 A1 Aug. 18, 2011

Related U.S. Application Data

(62) Division of application No. 12/007,369, filed on Jan. 9, 2008, now abandoned.

(30) Foreign Application Priority Data

Sep. 28, 2007 (KR) .......... 10-2007-0097719

(51) Int. Cl.
*H05K 3/30* (2006.01)
*H05K 1/16* (2006.01)
*H05K 3/00* (2006.01)
(Continued)

(52) U.S. Cl.
CPC .......... *H05K 1/162* (2013.01); *H05K 3/0035* (2013.01); *H05K 3/4069* (2013.01); *H05K 3/4602* (2013.01); *H05K 2201/0187* (2013.01); *H05K 2201/0394* (2013.01); *H05K 2201/09509* (2013.01); *H05K 2201/09563* (2013.01)

USPC ............ 29/832; 29/825; 29/830; 29/846; 29/852

(58) Field of Classification Search
CPC .......... H01L 24/81; H01I 23/49816; H01I 23/49833; H01I 23/641
USPC .................. 29/825, 830, 846, 852, 832
See application file for complete search history.

(56) References Cited

U.S. PATENT DOCUMENTS

| | | | |
|---|---|---|---|
| 6,407,929 B1 | 6/2002 | Hale et al. | |
| 6,597,583 B1 | 7/2003 | Sasaki | |
| 6,952,049 B1 * | 10/2005 | Ogawa et al. | 257/700 |

(Continued)

OTHER PUBLICATIONS

U.S. Appl. No. 12/007,369, filed Jan. 9, 2008, Han Kim et al., Samsung Electro-Mechanics Co., Ltd.
(Continued)

*Primary Examiner* — Carl Arbes

(57) ABSTRACT

A method of fabricating a cavity capacitor embedded in a printed circuit board including two conductive layers to be used as a power layer and a ground layer, respectively, and a first dielectric layer, placed between the two conductive layers, the method including: removing an upper conductive layer and the first dielectric layer excluding a lower conductive layer of the two conductive layers to allow a cavity to be formed between the two conductive layers, the lower conductive layer being supposed to be used as any one of electrodes of the cavity capacitor; stacking a dielectric material on the cavity to allow a second dielectric layer having a lower stepped portion than the first dielectric layer to be formed in the cavity; and stacking a conductive material on an upper part of the second dielectric layer and side parts of the cavity to allow the upper conductive layer to be used as the other electrode of the cavity capacitor.

5 Claims, 12 Drawing Sheets

(51) Int. Cl.
*H05K 3/40* (2006.01)
*H05K 3/46* (2006.01)

(56) References Cited

U.S. PATENT DOCUMENTS

2006/0044734 A1 3/2006 Ahn et al.
2006/0207791 A1 9/2006 Kim et al.

OTHER PUBLICATIONS

U.S. Patent Restriction Requirement, mailed Dec. 8, 2010, issued in corresponding U.S. Appl. No. 12/007,369.

U.S. Patent Office Action, mailed Feb. 2, 2011, issued in corresponding U.S. Appl. No. 12/007,369.

* cited by examiner

METHOD OF FABRICATING CAVITY CAPACITOR EMBEDDED IN PRINTED CIRCUIT BOARD

CROSS-REFERENCE TO RELATED APPLICATIONS

This application is a U.S. divisional application filed under 37 USC 1.53(b) claiming priority benefit of U.S. Ser. No. 12/007,369 filed in the United States on Jan. 9, 2008 now abandoned, which claims earlier priority benefit to Korean Patent Application No. 10-2007-0097719 filed with the Korean Intellectual Property Office on Sep. 28, 2007, the disclosures of which are incorporated herein by reference.

BACKGROUND

1. Field

The present invention relates to a printed circuit board, more specifically to a method of fabricating a cavity capacitor in a printed circuit board and a printed circuit board having an embedded cavity capacitor.

2. Description of the Related Art

Today's trend toward compact, thin film and light-weighted electronic apparatuses needs compact, thin film and light-weighted printed circuit boards. The conventional art has mounted a passive element such as capacitor and resistance on a surface of a printed circuit board, which results in the decrease of the surface area of printed circuit board. This makes it difficult to mount other electronic parts or electronic elements on the surface of the printed circuit board. Accordingly, the imbedded process, which mounts electronic parts or electronic elements inside the printed circuit board, has recently been in the limelight. The imbedded process locating electronic elements such as capacitor and resistance inside the board leads to the decrease of the thickness, size and volume of printed circuit board and the length of circuit, to thereby reduce impedance and noise largely. This will be very helpful for compact, thin film, light-weighted and high-density electronic apparatuses.

Thus, the technologies on the method for more simply mounting electronic elements inside the printed circuit board and a printed circuit board having embedded electronic elements have been developed.

SUMMARY

Accordingly, the present invention provides a cavity capacitor fabrication method and a printed circuit board having an embedded cavity capacitor that can have a high capacity and high efficiency.

The present invention also provides a cavity capacitor fabrication method and a printed circuit board having a embedded cavity capacitor that can make a printed circuit board compact, thin film and light-weighted.

The present invention also provides a cavity capacitor fabrication method and a printed circuit board having a embedded cavity capacitor that can not only simplify a manufacturing process but also largely reduce a manufacturing time and cost.

In addition, present invention provides a cavity capacitor fabrication method and a printed circuit board having an embedded cavity capacitor that can decrease the impedance and noise of printed circuit board.

An aspect of the present invention features a printed circuit board having an embedded cavity capacitor, including two conductive layers to be used as a power layer and a ground layer, respectively; and a first dielectric layer, placed between the two conductive layers. Here, the cavity capacitor is placed between the two conductive layers, the cavity capacitor being formed to allow a second dielectric layer to have a lower stepped portion than the first dielectric layer, and the second dielectric layer using the two conductive layers as a first electrode and a second electrode, respectively, and placed between the first electrode and the second electrode.

Here, the second dielectric layer can be formed to have a higher dielectric constant than the first dielectric layer.

A plurality of cavity capacitors can be arranged between the two conductive layers.

The cavity capacitor can use any one of the two conductive layers as any one electrode as it is.

The cavity capacitor can have any one shape of a circle, an ellipse and a polygon when viewed from an upper part of the printed circuit board.

The cavity capacitor can be formed close to any one of the two conductive layers. At this time, a conductive material can be charged to a cavity formed in a space between the other conductive layer and the cavity capacitor.

The conductive material to be charged to the cavity can be the same material as the other conductive layer or a conductive paste.

Another aspect of the present invention features a method of fabricating a cavity capacitor embedded in a printed circuit board including two conductive layers to be used as a power layer and a ground layer, respectively, and a first dielectric layer, placed between the two conductive layers. The method can include steps of removing an upper conductive layer and the first dielectric layer excluding a lower conductive layer of the two conductive layers to allow a cavity to be formed between the two conductive layers, the lower conductive layer being supposed to be used as any one of electrodes of the cavity capacitor; stacking a dielectric material on the cavity to allow a second dielectric layer having a lower stepped portion than the first dielectric layer to be formed in the cavity; and stacking a conductive material on an upper part of the second dielectric layer and side parts of the cavity to allow the upper conductive layer to be used as the other electrode of the cavity capacitor.

Here, the cavity capacitor can have any one shape of a circle, an ellipse and a polygon when viewed from an upper part of the printed circuit board.

The second dielectric layer can be formed to have a higher dielectric constant than the first dielectric layer.

The step of stacking the conductive material on the upper part of the second dielectric layer and the side parts of the cavity can include charging the conductive material to all spaces excluding a part in which the second dielectric layer is stacked in the cavity.

The conductive material is the same material as the first conductive layer or a conductive paste.

BRIEF DESCRIPTION OF THE DRAWINGS

These and other features, aspects and advantages of the present invention will become better understood with regard to the following description, appended claims and accompanying drawings where:

DESCRIPTION OF EMBODIMENTS

Figure 1:
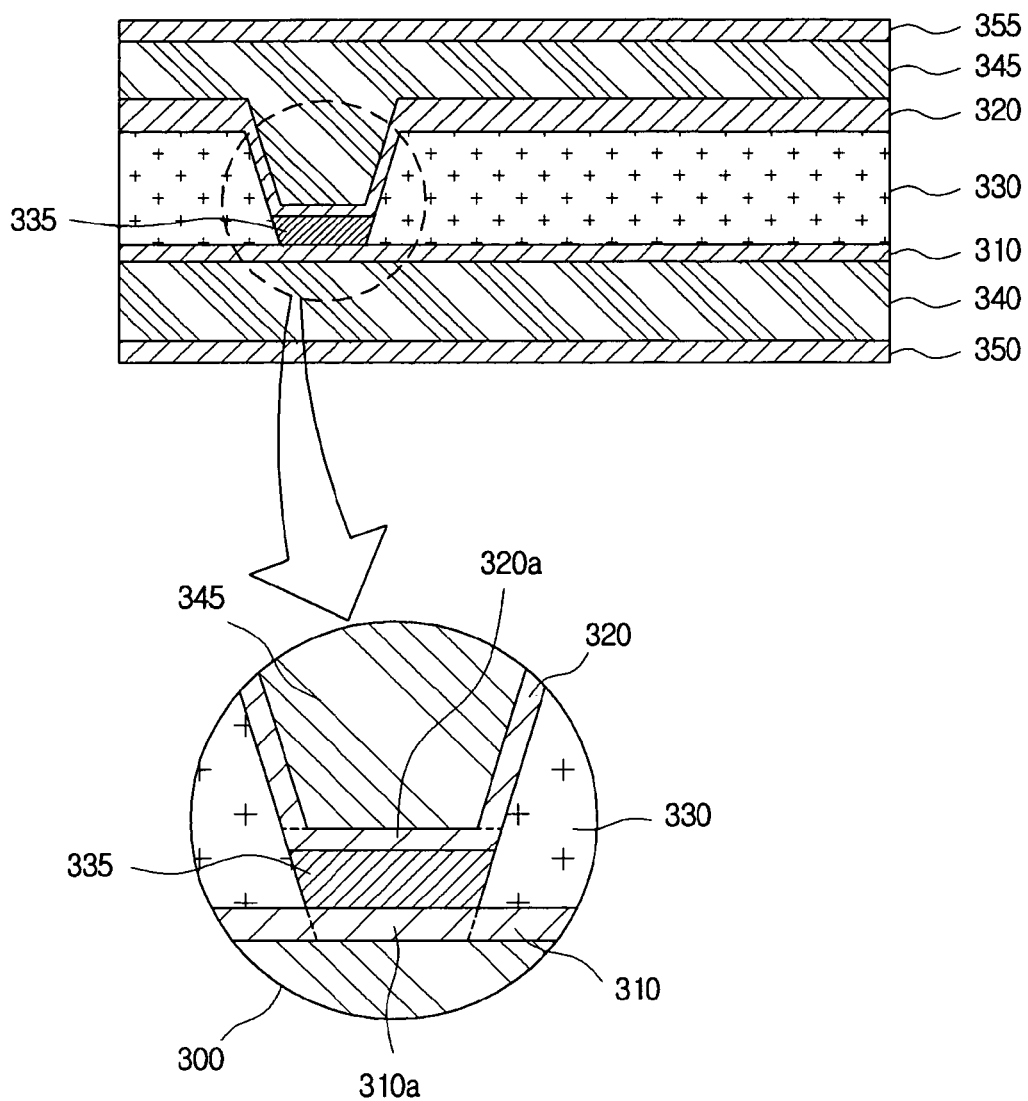
FIG. 1 is a side view showing a printed circuit board having an embedded cavity capacitor in accordance with an embodiment of the present invention.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, some embodiments of the present invention will be described in detail with reference to the accompanying drawings FIG. 1 is a side view showing a printed circuit board having an embedded cavity capacitor in accordance with an embodiment of the present invention.

Referring to FIG. 1, the printed circuit board in accordance with an embodiment of the present invention can include a first conductive layer 310, a second conductive layer 320, a dielectric layer 330 placed between the first conductive layer 310 and the second conductive layer 320 and a cavity capacitor 300 embedded between the first conductive layer 310 and the second conductive layer 320. Here, the cavity capacitor 330 can consist of a first electrode 310a, a second electrode 320a and a second dielectric layer 335 placed between the first electrode 310a and the second electrode 320a.

At this time, FIG. 1 shows a printed circuit board having a both side multi-layer in which the first conductive layer 310 is placed between other dielectric layers (i.e. a third dielectric layer 340 and a fourth dielectric layer 345), and the second conductive layer 320 is placed between other conductive layers (i.e. a third conductive layer 350 and a fourth conductive layer 355). However, the printed circuit board as shown in FIG. 1 is merely an example. It is obvious that the present invention is not limited to the example. Any printed circuit board having the structure, including two conductive layers to be used as each of a power layer and a ground layer between which the cavity capacitor can be embedded, is applicable to the present invention without restriction. Accordingly, the below description is based on the relationship between the first conductive layer 310, the second conductive layer 320 and the first dielectric layer 330, which are placed in a surrounding area based on a position located with the cavity capacitor 300, and the first electrode 310a, the second electrode 320a and the second dielectric layer 335, which form the cavity capacitor 300.

The cavity capacitor 300 of the present invention can use each of the first conductive layer 310 and the second conductive layer 320 of the printed circuit board as electrodes. For example, in the case of FIG. 1, a part (refer to 310a in FIG. 1) corresponding to the surface, in contact with the second dielectric layer 335, of the first conductive layer 310 can be used as the first electrode of the cavity capacitor 300. Also, a part (refer to 320a in FIG. 1) corresponding to the surface, in contact with the second dielectric layer 335, of the second conductive layer 320 can be used as the second electrode of the cavity capacitor 300. Here, since one of the first conductive layer 310a and the second conductive layer 320a of the printed circuit board is used as the power layer and the other is used as the ground layer, the first electrode 310a and the second electrode 320a will be able to generally function as one capacitor by supplying a power having a different value to the first electrode 310a and the second electrode 320a, respectively, together with the second dielectric layer 355 therebetween.

As such, in accordance with the present invention, since the cavity capacitor embedded in the printed circuit board uses the two conductive layers, which are used as the power layer and the ground layer in the printed circuit layer, as each of the electrodes as they are, it is unnecessary to add an additional stacking process for forming an electrode and an additional connection process using a via of the power layer or the ground layer. Accordingly, the present invention can have a very simple manufacturing method based on an aspect of process. Beside that, the printed circuit board of the present invention can have a very simple structure. As a result, the complexity of printed circuit board can be largely reduced and a compact and thin film printed circuit board can be easily manufactured, as compared with the conventional printed circuit board.

The second dielectric layer 335 included in the cavity capacitor 300 can be formed with a stepped portion that is lower than the first dielectric layer 330 stacked in a surrounding area of the second dielectric layer 335. As such, if the stacked thickness of the second dielectric layer 335 is lower than a dielectric layer in the surrounding area, the electric capacitor of the cavity capacitor 300 can be increased in reverse proportion thereto. Also, if the second dielectric layer 335 is formed to consist of a dielectric material having a higher dielectric constant than the first dielectric layer 330 in the surrounding area, the cavity capacitor having higher capacity and higher efficiency will be able to be manufactured. Of course, the more increased surface of the second dielectric layer 330 can obviously result in the increase of the electric capacity.

Hereinafter, the cavity capacitor fabrication method in accordance with an embodiment of the present invention will be described with reference to FIG. 2A through FIG. 2D.

Figure 2A:
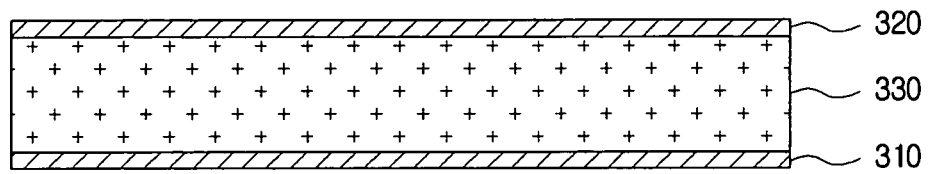
FIG. 2A through 2D illustrate a method of fabricating a cavity capacitor based on the printed circuit board shown in FIG. 1.
Figure 2B:
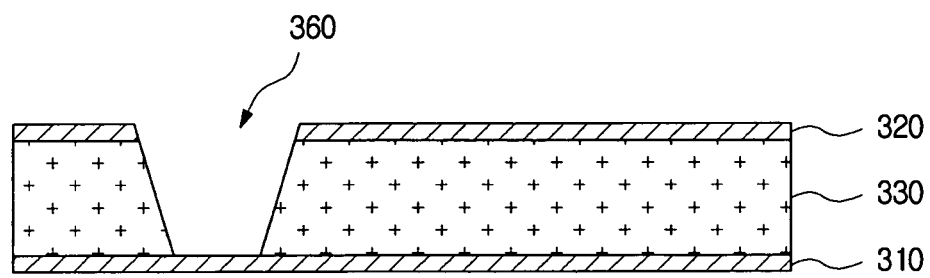

FIG. 2A through 2B illustrate the method of fabricating a cavity capacitor based on the printed circuit board shown in FIG. 1. Particularly, FIG. 2A through 2B illustrate the elements placed between the first conductive layer 310 and the second conductive layer 320 in FIG. 1 for the convenience of illustration.

Referring to FIG. 2A, the structure in which the first conductive layer 310, the second conductive layer 320 and the first dielectric layer 330 placed therebetween are illustrated. For example, copper clad laminates in which a dielectric material is placed and both sides of the dielectric material are clad with copper can have the same structure as FIG. 2A.

Referring to FIG. 2B, the second conductive layer 320 and the first dielectric layer 330 can be removed and the first conductive layer 310 can remain in the structure of FIG. 2A in order that a cavity 360 can be formed at a position between the first conductive layer 310 and the second conductive layer 320.

For example, the cavity 360 can be formed at a position between the first conductive layer 310 and the second conductive layer 320 by using a laser drill process. At this time, the size, area and shape of the cavity 360 formed through the laser drill processor can function as a first factor that determines the property (e.g. electric capacity) of the cavity capacitor, finally manufactured. Accordingly, the printed circuit board is required to be designed so as to have the optimized properties considering design specifications, conditions and applicable technological fields.

As an example, FIG. 4A through FIG. 4E illustrate various types of the cavity 360 formed between the first conductive layer 310 and the second conductive layer 320. In particular, FIG. 4A through FIG. 4E illustrate the size and shape of an upper surface 360a of the cavity 60 when viewed from an upper side of the printed circuit board. Even tough FIG. 4A through FIG. 4E illustrate the case of a plurality of cavities 360, having shapes such as circles, ellipses, squares, line-bands and triangles, arranged between the first conductive layer 310 and the second conductive layer, it is obvious that the cavity capacitor of the present invention having various shapes, sizes, areas and quantity can be embedded in the printed circuit board.

The reason that the first conductive layer 210 is not removed in FIG. 2B is because a part corresponding to the surface, formed with the cavity 360, of the first conductive layer 310 can be used as an electrode of the cavity capacitor later. Accordingly, although the first conductive layer 310 is used as an electrode of the cavity capacitor as it is in FIG. 2B, it is obvious that various modifications are possible within the limitation in which the first conductive layer 310 can be used as the electrode of the cavity capacitor.

Figure 2C:
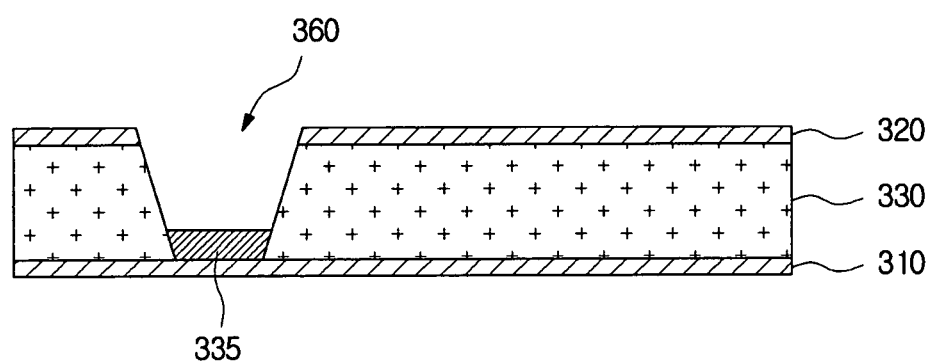

Referring to FIG. 2C, the dielectric material can be stacked in the cavity 360 formed. At this time, the second dielectric layer 335 having a lower stepped portion than the first dielectric layer 330 can be formed in the cavity 360 by determining the stacked thickness of the dielectric material to be lower than the first dielectric layer 330. Also, at this time, a material having a higher dielectric constant than the dielectric layer 330 can be used as the dielectric material stacked in the cavity 360 as described above.

Accordingly, if the thickness, area and dielectric material of the second dielectric layer 335, stacked in the cavity 360 through the process, are appropriately adjusted, the cavity capacitor having the electrical property desired by a designer can be manufactured.

Of course, at this time, since it is unnecessary that the second dielectric layer 335 has a dielectric material that is different from the first dielectric layer 330, if the second dielectric layer 335 having the same dielectric material as the first dielectric layer 330 is formed, the first dielectric layer 330 may not be completely removed and a part of the first dielectric layer 330 may remain in an etching process of FIG. 2B. Of course, in this case, the same process as FIG. 2C may be unnecessary.

Figure 2D:
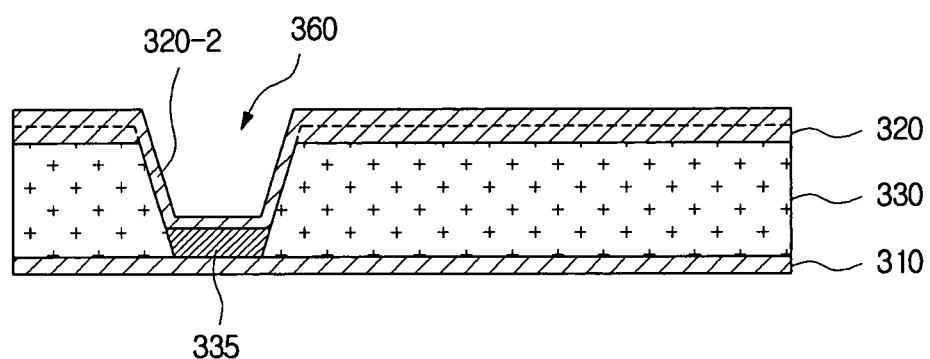

Referring to FIG. 2D, a conductive material can be stacked in an upper part of the second dielectric layer 335 and a lateral side part (i.e. an inclined surface) of the cavity 360 (refer to 320-2 of FIG. 2D). Through the stacking process of the conductive material, the other electrode can be formed in the upper part of the second dielectric layer 335. The formed electrode can be electrically connected to the second conductive layer 320.

FIG. 2D uses the method stacking thinly the conductive material on the upper part of the second dielectric layer 335 and the lateral side part of the cavity 360 in order to be electrically connected to the second conductive layer 320. Of course, various methods can be alternatively used.

For example, the method charging all spaces of the cavity 360 excluding a part in which the second dielectric layer 335 is stacked in by using the conductive material can be used. This is illustrated through FIG. 3A through 3B as another embodiment of the present invention.

Figure 3A:
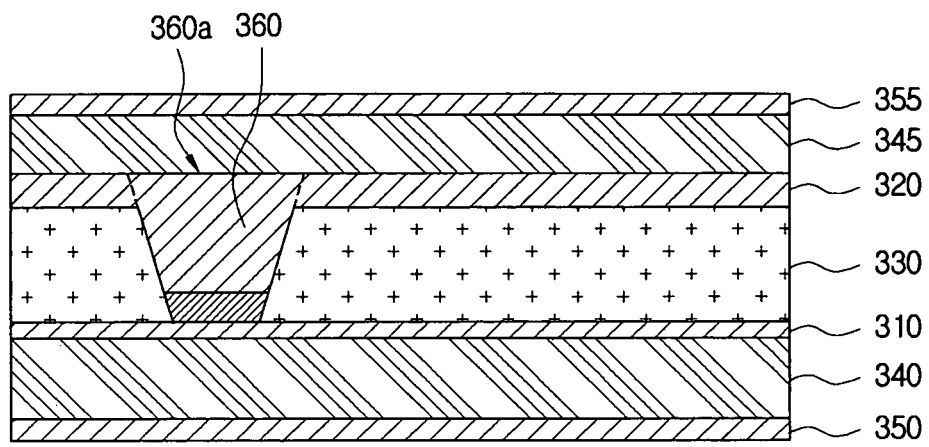
FIG. 3A is a side view showing a printed circuit board having a embedded cavity capacitor in accordance with another embodiment of the present invention.
Figure 3B:
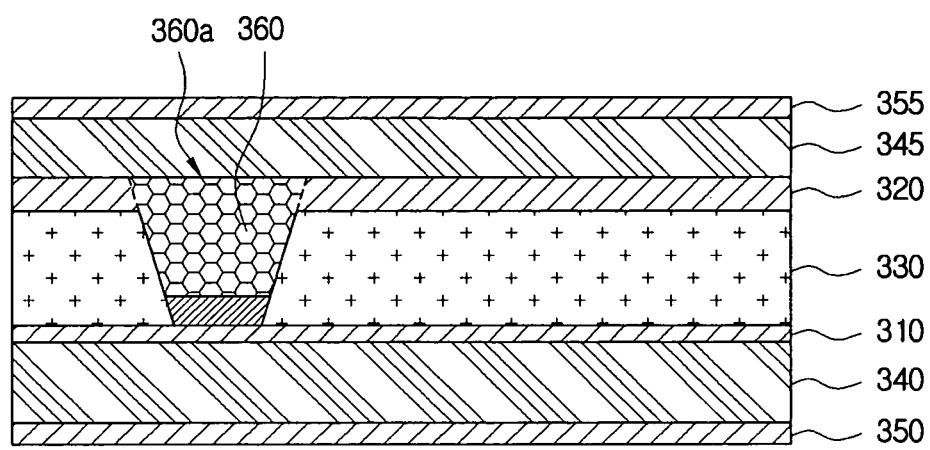
FIG. 3B is a side view showing a printed circuit board having a embedded cavity capacitor in accordance with another embodiment of the present invention.
Figure 4A:
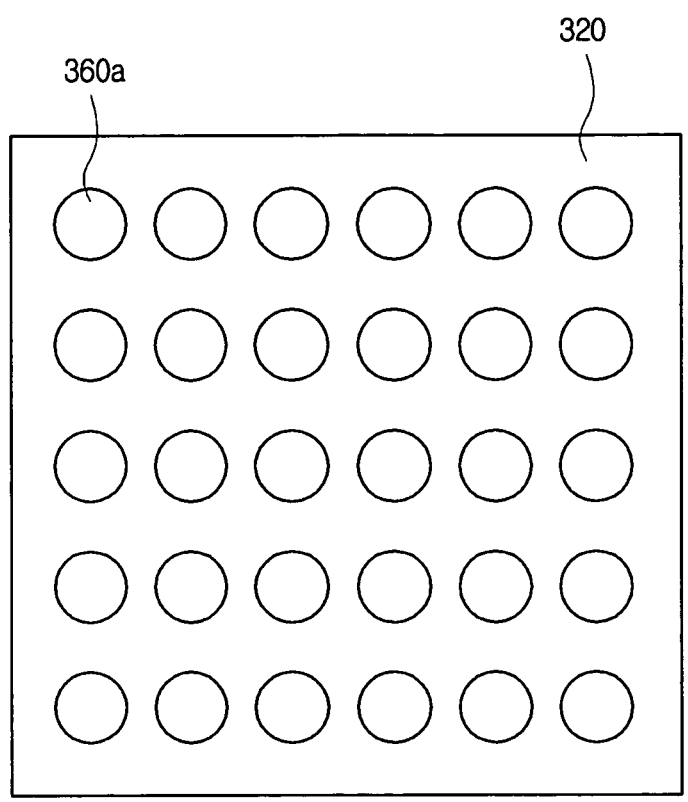
FIG. 4A through FIG. 4E illustrate various types of a cavity when a printed circuit printed board having an embedded cavity capacitor is viewed from an upper side.
Figure 4B:
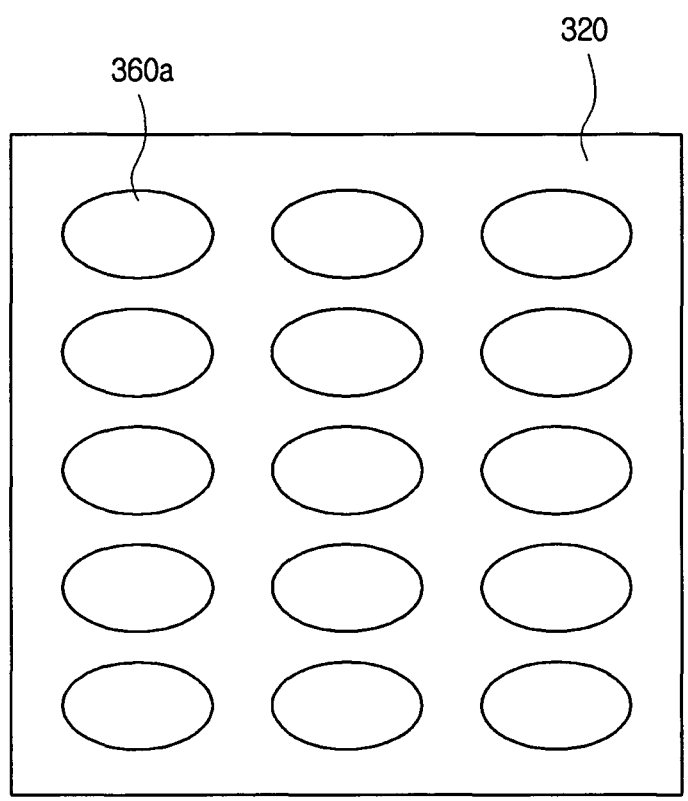
Figure 4C:
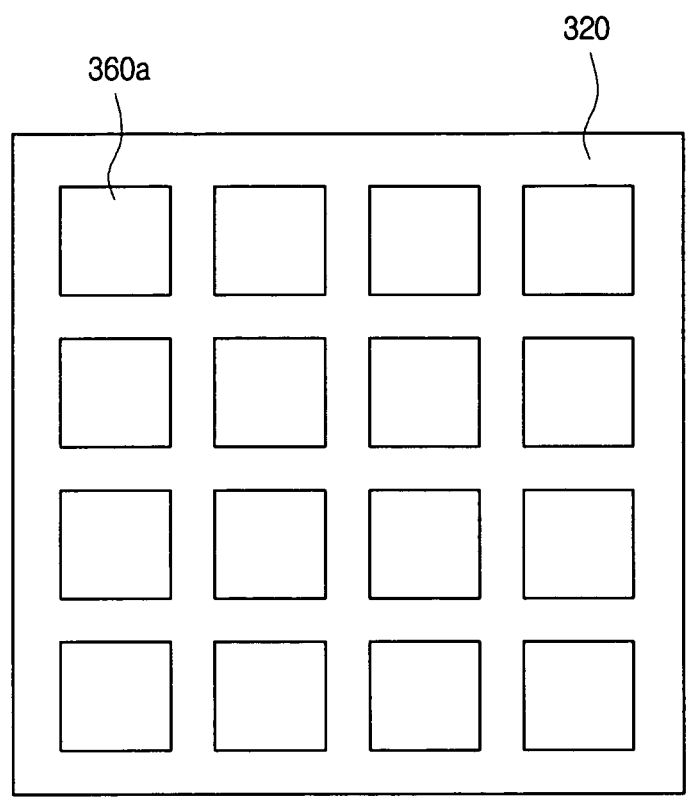
Figure 4D:
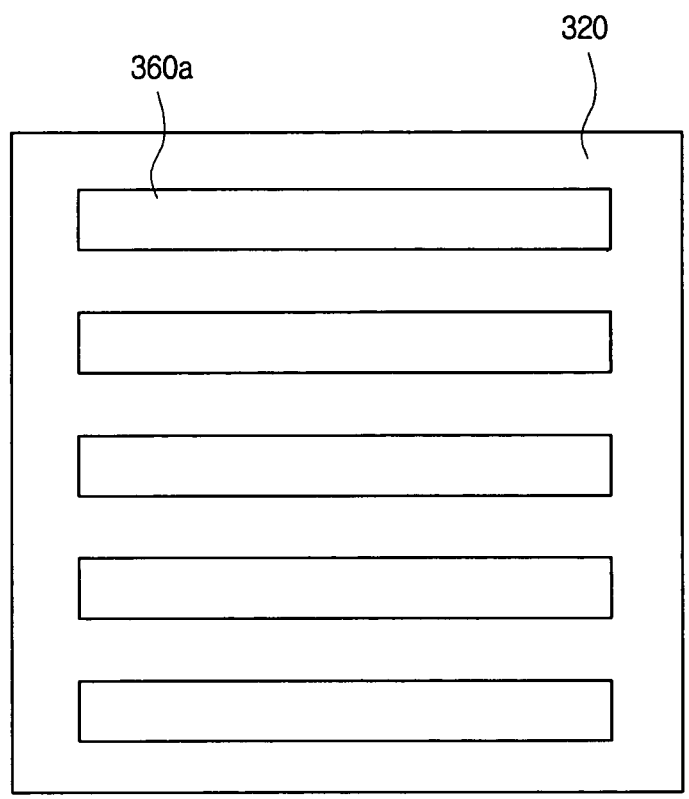
Figure 4E:
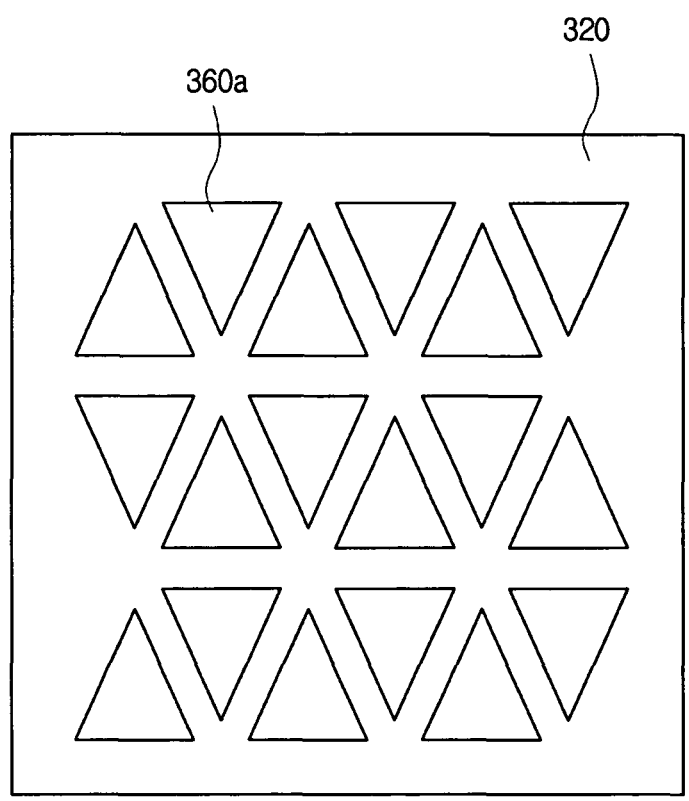

While FIG. 3A shows the part, stacked with the second dielectric layer 335, of the cavity 360 is completely filled with the same material as the material forming the second conductive layer 320, FIG. 3B shows the part, stacked in with the second dielectric layer 335, of the cavity 360 is filled with the different material (e.g. a conductive paste) from the material forming the second conductive layer 320.

As described above, it is possible to manufacture the cavity capacitor embedded in the printed circuit board through the one-time etching process for forming the cavity 360 and the two-time stacking process for forming the second dielectric layer 335 and the electrode in accordance with the present invention. Accordingly, the manufacturing process can be very simplified and also the manufacturing time and cost can be largely reduced.

The above description is based on the printed circuit board having the embedded cavity capacitor, illustrated FIG. 1 through FIG. 3B. In the forgoing description with reference to FIG. 1 through FIG. 3B, since the cavity capacitor 300 is formed close to the first conductive layer 310 of the printed circuit board, the second electrode 320a of the cavity capacitor 300 can be electrically connected to the second conductive layer 320 in the U-shape. Alternatively, it can be easily understood by any person of ordinary skill in the art that the cavity capacitor having various shapes is able to be embedded in the printed circuit board in accordance with the present invention.

In other words, if the cavity capacitor 300 is possible to be placed between the first conductive layer 310 and the second conductive layer 320 and is possible to electrically function as a capacitor by allowing the second dielectric layer 335 to have a lower stepped portion than the first dielectric layer 330 in a surrounding area, the shape and stacked structure of the cavity capacitor 300 may have no limitation.

For example, since the cavity capacitor of the present invention can be formed close to the second conductive layer 320, the cavity capacitor can have various shapes and stacked structures such as the shape allowing the first electrode 310 to be electrically connected to the first conductive layer 310 in an 'n' shape and the shape allowing the cavity capacitor to be formed at a center space between the first conductive layer 310 and the second conductive layer 320. As such, if the shape and stacked structure that the cavity capacitor is embedded in the printed circuit board are changed, it is obvious that the corresponding manufacturing method may be different from that of FIG. 2.

Hitherto, although some embodiments of the present invention have been shown and described for the above-described objects, it will be appreciated by any person of ordinary skill in the art that a large number of modifications, permutations and additions are possible within the principles and spirit of the invention, the scope of which shall be defined by the appended claims and their equivalents.

What is claimed is:

1. A method of fabricating a cavity capacitor embedded in a printed circuit board including two conductive layers to be used as a power layer and a ground layer, respectively, and a first dielectric layer, placed between the two conductive layers, the method comprising:

removing an upper conductive layer and the first dielectric layer excluding a lower conductive layer of the two conductive layers to allow a cavity to be formed between the two conductive layers, the lower conductive layer being supposed to be used as any one of electrodes of the cavity capacitor;

stacking a dielectric material on the cavity to allow a second dielectric layer having a lower stepped portion than the first dielectric layer to be formed in the cavity; and stacking a conductive material on an upper part of the second dielectric layer and side parts of the cavity to allow the upper conductive layer to be used as the other electrode of the cavity capacitor.

2. The method of claim 1, wherein the cavity capacitor has any one shape of a circle, an ellipse and a polygon when viewed from an upper part of the printed circuit board.

3. The method of claim 1, wherein the second dielectric layer is formed to have a higher dielectric constant than the first dielectric layer.

4. The method of claim 1, wherein the stacking the conductive material on the upper part of the second dielectric layer and the side parts of the cavity comprises charging the conductive material to all spaces excluding a part in which the second dielectric layer is stacked in the cavity.

5. The method of claim 4, wherein the conductive material is the same material as the first conductive layer or a conductive paste.

* * * * *